United States Patent [19]

Yasuoka

[11] Patent Number: 4,661,928
[45] Date of Patent: Apr. 28, 1987

[54] OUTPUT BUFFER IN WHICH INDUCTIVE NOISE IS SUPPRESSED

[75] Inventor: Nobuyuki Yasuoka, Tokyo, Japan
[73] Assignee: NEC Corporation, Tokyo, Japan
[21] Appl. No.: 675,586
[22] Filed: Nov. 28, 1984
[30] Foreign Application Priority Data Nov. 28, 1983 [JP] Japan .............................. 58-223720

[51] Int. Cl.$^4$ .............................................. G11C 7/00
[52] U.S. Cl. .................................... 365/189; 365/206; 307/575
[58] Field of Search .............. 365/189, 190, 202, 206, 365/207, 230; 307/242, 575

[56] References Cited

U.S. PATENT DOCUMENTS 4,397,000 8/1983 Nagami .............................. 365/189

OTHER PUBLICATIONS

Japanese Laid-open application No. 57-167197, Oct. 14, 1982.

*Primary Examiner*—Joseph A. Popek
*Attorney, Agent, or Firm*—Sughrue, Mion, Zinn, Macpeak & Seas

[57] ABSTRACT

An output buffer used in, for example, a semiconductor memory device, comprises a first transistor connected between a power potential supply terminal and a data output terminal and a second transistor connected between a reference potential supply terminal and the data output terminal. In response to the data stored in a selected memory cell, either one of the first and second transistors is turned ON to change the potential at the data output terminal to a level corresponding to the data at a first rate. The output buffer further comprises a third transistor connected between the gate of the second transistor and the power potential supply terminal. The third transistor is turned ON before the data stored in the selected memory cell is supplied to the output buffer to vary the potential at the data output terminal to the reference potential at a second rate smaller than the first rate.

16 Claims, 10 Drawing Figures

1

OUTPUT BUFFER IN WHICH INDUCTIVE NOISE IS SUPPRESSED

BACKGROUND OF THE INVENTION

The present invention relates to an output buffer through which data are outputted externally, and more particularly to a data output buffer used in a semiconductor memory device formed as an integrated circuit device.

A semiconductor memory device has a plurality of memory cells, and a predetermined cell or cells are selected by an address decoder in response to address signals. The data stored in the selected memory cell or cells are amplified by a sense amplifier, and then read out to an external data bus through an output buffer. The output buffer includes first and second insulated gate field effect transistors (IGFETs) such as MOS (metal-oxide-semiconductor) transistors connected in series between first and second power supply terminals. The first power supply terminal may be supplied with a positive or negative power potential, and the second power supply terminal may be supplied with a reference potential such as a ground potential. The connection point of the first and second transistors is derived as a data output terminal which is in turn connected to an external data bus. The first and second transistors are supplied at their gates with the true and complementary outputs of the sense amplifier, respectively. Accordingly, either one of the first and second transistors is turned ON in response to the data stored in the selected memory cell, and the data output terminal takes a high level or a low level.

The output buffer further includes third and fourth IGFETs supplied with an output control signal. The third transistor is connected between the gate of the first transistor and the second power supply terminal, and the fourth transistor is connected between the gate of the second transistor and the second power supply terminal. When the third and fourth transistors are turn ON, the potentials at the gates of the first and second transistors are clamped to the level at the second power supply terminal. The first and second transistors are thereby turned OFF to bring the data output terminal into a high impedance state. As a result, the data stored in the memory cells are not read out, and the external data bus can transfer the data read out from another memory device, for example.

When the output control signal disappears, the third and fourth transistors are turned OFF to activate the output buffer. At least one memory cell is thereafter selected, and the data stored therein is supplied to the sense amplifier. The sense amplifier responds to the data supplied, and produces the true and complementary outputs thereof. The first transistor or the second transistor is thus turned ON. The data bus line connected to the data output terminal can be regarded as a capacitive load having a relatively large capacitance value. Accordingly, the capacitive load is charged through the first transistor by a charging current from the first power supply terminal, or is discharged by the second transistor, the discharging current flowing into the second power supply terminal. The sense amplifier holds the true and complementary outputs until another memory cell is selected or the output control signal is generated. When another memory cell is selected, the sense amplifier produces true and complementary outputs corresponding to the data stored in the newly selected memory cell. If the complementary output is thereby changed from the low level to the high level, the second transistor is turned ON to discharge the capacitive load connected to the data output terminal. On the other hand, the first transistor is turned OFF.

In order to read out the data stored in the selected memory cell to the data output terminal at a high speed, the sense amplifier performs the change in levels of its true and complementary outputs for a very short time to quickly turn one of the first and second transistors ON and the other of them OFF, respectively. In other words, the charging and discharging of the capacitive loads are attained within a considerably short time. Such rapid charging and discharging cooperate with the impedance and inductance components of power supply lines to cause an inductive noise at the first and second power supply terminals. In particular, the potential at the second power supply terminal is used as a reference potential for the high and low levels, and therefore, the inductive noise at the second power supply terminal pulls up the reference potential to bring the memory device into a read operation. The inductive noise may be suppressed by making the charging and discharging times long, but in that case the data readout speed becomes slow.

SUMMARY OF THE INVENTION

It is, therefore, an object of the present invention to provide an output buffer in which inductive noise is suppressed without making the data output speed slow.

Another object of the present invention is to provide a semiconductor memory device having an improved data output buffer.

Still another object of the present invention is to provide a memory device having a broadened range of operability.

According to one aspect of the present invention an output buffer comprises first and second power supply terminals, first and second field effect transistors connected in series between the first and second power supply terminals, an output terminal connected to a connection point of the first and second transistors, first means for supplying a data signal to the first and second transistors in a complementary manner, a third field effect transistor connected between a gate of the first transistor and the second power supply terminal, a fourth field effect transistor connected between a gate of the second transistor and the second power supply terminal, second means for generating a first control signal used for turning the third and fourth transistors ON, third means for supplying the first control signal to the third and fourth transistors, fourth means for generating a second control signal in response to a change from a present state to an absent state of the first control signal, and fifth means responsive to the second control signal for turning the second transistor ON.

According to another aspect of the present invention, there is provided a memory device comprising a plurality of memory cells arrayed in a matrix form, first means responsive to address signals for selecting at least one of the memory cells, second means responsive to data stored in the selected memory cell for producing true and complementary outputs corresponding to the data, a data output terminal, first and second power supply terminals, a data buffer including a first transistor supplied with the true output and connected between the first power supply terminal and the data output terminal and a second transistor supplied with the complementary output and connected between the second power supply terminal and the data output terminal, and third means responsive to a control signal used for a data read operation for turning the second transistor ON before the true and complementary outputs are supplied to the first and second transistors.

If the memory device is of a static type, the address signals may be employed as the control signal. This is because the memory cell to be selected is varied in response to the change in the address signals. The second transistor is turned ON every time the address signals change. On the other hand, the true and complementary outputs are supplied to the first and second transistor after a time delay from a time point when the address signal changes. Accordingly, the potential at the data output terminal is changed to the potential at the second power supply terminal before the data appears at the data output terminal. In other words, the data output terminal has been already discharged or charged at a time point when the true and complementary outputs are supplied to the data output buffer. An inductive noise is suppressed, which otherwise would be generated at the second power supply terminal with a large value when the second transistor is turned ON by the complementary output.

In the case of a dynamic type memory in which row and column address input signals are introduced in synchronism with row and column address strobe signals, respectively, the address signals cannot be employed as the control signal. The output buffer is activated in response to the column address strobe signal, and therefore this signal may be employed as the control signal.

BRIEF DESCRIPTION OF THE DRAWINGS

The above and other objects, advantages and features of the present invention will be more apparent from the following description taken in conjunction with the accompanying drawings in which.

DETAILED DESCRIPTION OF THE PREFERRED EMBODIMENTS

Figure 1:
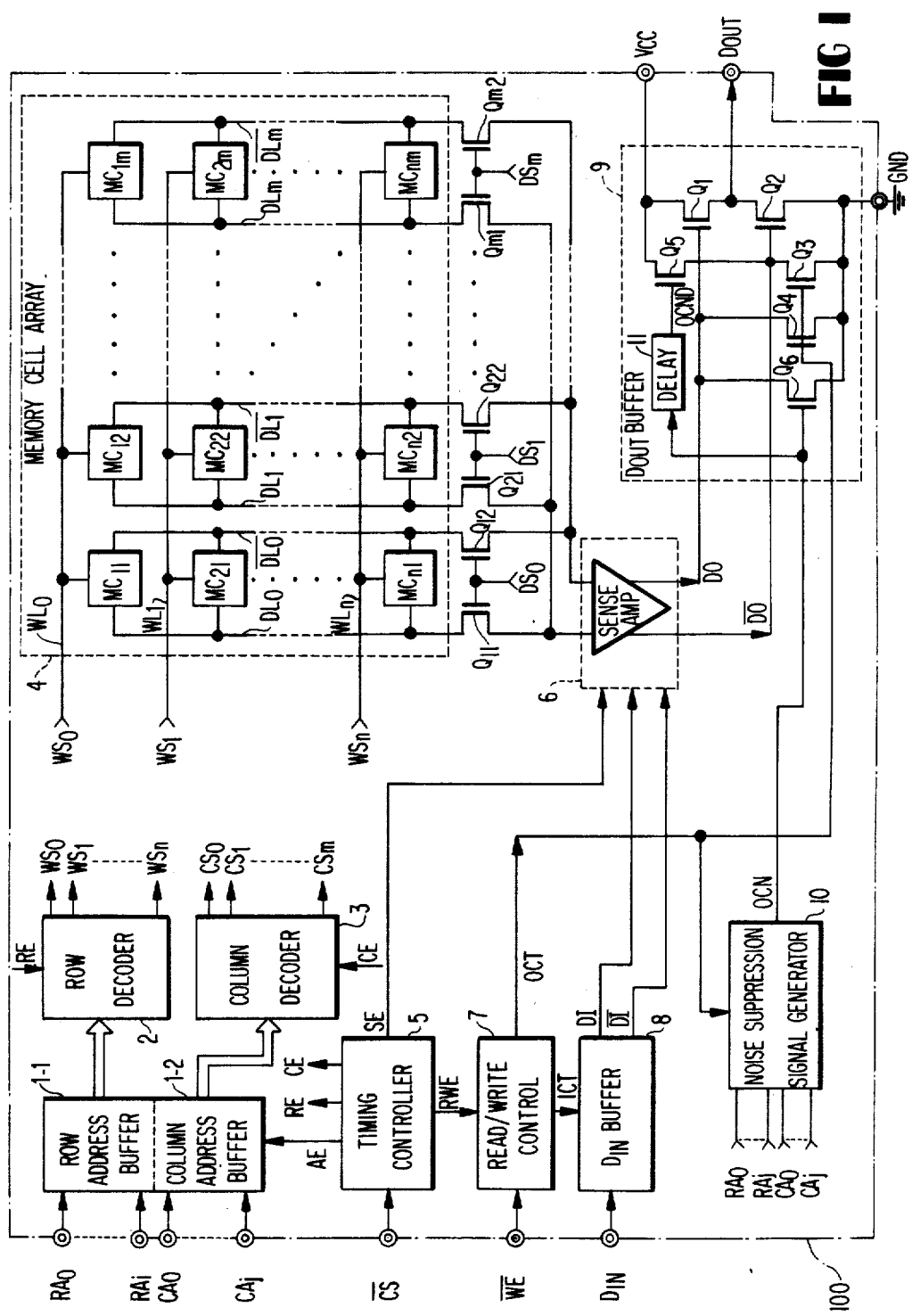
FIG. 1 is a block diagram of a memory device according to an embodiment of the present invention.

Referring to FIG. 1, a semiconductor memory device according to an embodiment of the present invention is shown as an integrated circuit device 100 which has row address input terminals $RA_o$ to $RA_i$, column address input terminals $CA_o$ to $CA_j$, chip-select terminal $\overline{CS}$, a write-enable terminal $\overline{WE}$, a data inut terminal $D_{IN}$, a data output terminal $D_{OUT}$, a first power supply terminal Vcc applied with a positive power potential, and a second power supply terminal GND applied with a reference potential (a ground potential in this embodiment). Row address signals from the terminal $RA_o$ to $RA_i$ are supplied through a row address buffer 1-1 to a row decoder 2, and column address signals from the terminal $CA_O$ to $CA_j$ are supplied to a column address buffer 1-2 to a column decoder 3. A memory cell array 4 includes a plurality of word lines $WL_O$ to $WL\underline{n}$, plural pairs of digit lines $(DL_O, \overline{DL_O})$ to $(DL_m, \overline{DL_m})$, and a plurality of memory cells $MC_{11}$ to $MC_{nm}$ disposed at the respective intersections of the word and digit lines. The row decoder 2 responds to the row address signals and produces one of word selection signals $WS_o$ to $WS_n$ to select one of the word lines $WL_O$ to $WL_n$. The column decoder 3 produces one of digital selection signals $DS_O$ to $DS_m$ in response to the column address signals, by which a pair of transfer gate transistors $(Q_{11}, Q_{12})$, $(Q_{21}, Q_{22})$, ..., or $(\theta_{m1}, Q_{m2})$ is turned ON to select a pair of digital lines. As a result, one of the memory cells $MC_{11}$ to $MC_{nm}$ is selected, and true and complementary data corresponding to the data stored in the selected memory cell are supplied to a sense amplifier 6 through the digit lines DL and $\overline{DL}$. The sense amplifier 6 responds thereto and produces true and complementary outputs DO, $\overline{DO}$. The amplifier 6 includes a flip-flop (not shown) to hold its outputs. An output buffer 9 includes transistors Q1 and Q2 respectively supplied with the outputs DO and $\overline{DO}$ of the sense amplifier 6 and connected in series between the power supplied terminals Vcc and GND. The connection point of the transistors Q1 and Q2 is derived as the data output terminal $D_{OUT}$. The output buffer 9 further includes a transistor, Q3 connected between the gate of the transistor Q1 and the terminal GND and a transistor Q4 connected between the gate of the transistor Q1 and the terminal GND. The transistors Q3 and Q4 are supplied with an output control signal OCT generated from a read/write controller 7. This controller 7 responds to a write-enable signal supplied to the terminal WE and also generates an input control signal ICT which is then supplied to a data input buffer 8. The input buffer 8 responds to the signal ICT of an activating level and produces true and complementary outputs DI and $\overline{DI}$ corresponding to data supplied to the data input terminal $D_{IN}$, which are supplied to the sense amplifier 6. A timing generator 5 responds to the chip-select signal $\overline{CS}$ and generates timing signals AE, RE, CE, SE and RWE to control the operation sequence of the above-mentioned blocks.

Figure 2:
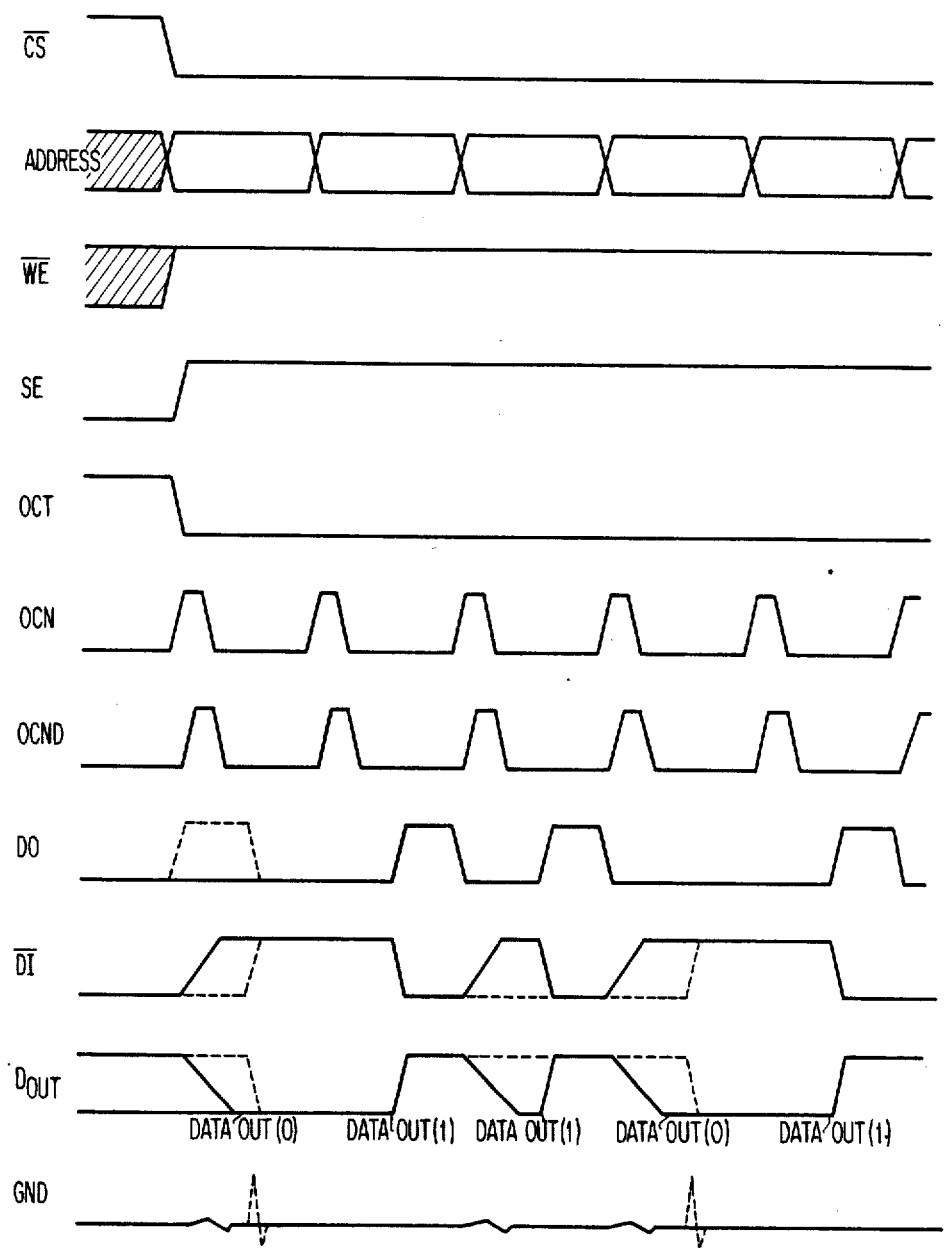
FIG. 2 is a timing chart of the memory device shown in FIG. 1.

The memory device shown in FIG. 1 is of a static type in which the read/write operation is carried out under the control of the chip-enable signal $\overline{CS}$. More specifically, when the chip-select signal $\overline{CS}$ has a high level as shown in FIG. 2, the timing controller 5 does not generate the timing signals AE to RWE to inactivate the respective blocks 1 to 9. In this case, the signal OCT takes a high level, and hence the transistors Q3 and Q4 are turned ON. The transistors Q1 and Q2 are thereby turned ON to bring the data output terminal $D_{OUT}$ into a high impedance state. As a result, the data read/write operation is not carried out.

When the chip-select $\overline{CS}$ is inverted to a low level, a data read operation or a data write operation is performed. The timing controller 5 responds to the inversion of the signal $\overline{CS}$ to the low level and produces the timing signals AE to RWE. The address buffers 1-1 and 1-2 thus latch the row and column address signals, and one of the memory cells $MC_{11}$ to MCnm is selected by the row and column decoders 2 and 3. The read/write controller 7 is also activated by the signal RWE. At this time, the write-enable signal $\overline{WE}$ takes a high level as shown in FIG. 2, and therefore the read/write controller 7 judges a data read operation mode. The input control signal ICT is thus maintained at the inactivating level to prevent the input data supplied through the terminal $D_{IN}$ from being latched in the input buffer 8. On the other hand, the output control signal OCT is changed to the low level, so that the transistors Q3 and Q4 are turned OFF.

The output buffer 9 further includes a transistor Q5 connected between the power terminal Vcc and the gate of the transistor Q2, and a transistor Q6 connected between gate of the transistor Q1 and the ground terminal GND. The transistor Q6 is supplied with a signal OCN generated from the noise suppression signal generator 10, which is also supplied to the transistor Q5 through a delay circuit 11. The signal generator 11 responds to the change in the signal OCT and address signals RAO to RAi and CAO to CAj and generates the signal OCN. This circuit arrangement is provided according to the present invention and suppresses an inductive noise at the ground terminal GND, which otherwise would be generated at the ground terminal GND with a large value. Before the explanation of its circuit operation as illustrated, a description will first be given for the case where this circuit is not provided.

In response to the inversion of the chip-select signal $\overline{CS}$ to the low level, the transistors Q3 and Q4 are turned OFF. Accordingly, the potentials at the gates of the transistors Q1 and Q2 are controlled by the outputs DO and $\overline{DO}$ of the sense amplifier 6. It should be noted that the data stored in the memory cell appears at the output DO and $\overline{DO}$ after a time necessary to select the memory cell has elapsed. Accordingly, the levels at the outputs DO and $\overline{DO}$ are determined by the characteristics of the sense amplifier 6 during a period from the time point when the signal OCT is changed to the low level to that when the data appears at the outputs DO and $\overline{DO}$. In general, the sense amplifier 6 is designed such that the output DO and $\overline{DO}$ take the high level and the low level, respectively, as shown by dotted line in FIG. 2. The data output terminal $D_{OUT}$ thus takes a high level.

When the selection of one memory cell ($MC_{11}$ for example) ends, the data stored in the cell $MC_{11}$ is supplied to the sense amplifier 6. Assuming that the data stored in the cell $MC_{11}$ is "0", the sense amplifier 6 makes its true and complementary outputs DO and $\overline{DO}$ a low level and a high level, respectively, as shown by dotted line in FIG. 2. The transistors Q1 and Q2 are thereby turned OFF and ON, respectively, to lower the potential at the data output terminal $D_{OUT}$ to the low level. In order to read out the data stored in the cell $MC_{11}$ to the data output terminal $D_{OUT}$ at a high speed, the sense amplifier 6 attains the change in levels of its true and complementary outputs DO and $\overline{DO}$ for a very short time to quickly turn the transistors Q1 and Q2 OFF and ON, respectively. This means that the electric charges stored in a capacitive load coupled to the output terminal $D_{OUT}$ are discharged to the ground terminal GND with rapidity. The ground terminal GND is connected with a ground line for applying the ground potential to the memory device, and the ground line has impedance and inductance components. As a result, the rapid discharging cooperates with the impedance and inductance components to generate an inductive noise at the ground terminal GND, as shown by dotted line in FIG. 2.

The data stored in the memory cells is held in the sense amplifier 6 until the data stored in another memory cell is supplied to the amplifier 6. If the new data supplied to the sense amplifier 6 is "1", the true and complementary outputs DO and $\overline{DO}$ are changed to the high level and low level, respectively the transistors Q1 and Q2 are thereby turned ON and OFF, respectively, to produce the high level at the output terminal $D_{OUT}$. If the data "1" is stored in a memory cell which is selected in a next time, the level at the terminal $D_{OUT}$ is not varied. The address signals are thereafter changed to select another memory cell. This memory cell stores the data "0". Accordingly, the outputs DO and $\overline{DO}$ are changed to the low level and high level, respectively. The transistors Q1 and Q2 are thereby turned OFF and ON, respectively. As a result, the inductive noise is generated again at the ground terminal GND, as shown by dotted line in FIG. 2.

In order to suppress the inductive noise at the GND terminal, the transistor Q5 is turned ON by the signal generator 10 before the data appears at the outputs DO and $\overline{DO}$ of the sense amplifier 6. More specifically, the noise suppression signal generator 10 responds to the change in level of the signal OCT and in the address signals and produces the signal OCN of a one-shot pulse shape, as apparent from FIG. 2. The signal OCN is supplied to the transistor Q6 and further supplied to the delay circuit 11 whose output signal OCND shown in FIG. 2 is supplied to the transistor Q5. Accordingly, the transistor Q6 is turned ON to response to the change of the signal OCT from the high level to the low level, by which the gate potential of the transistor Q1 is held at the low level. After a time delay, the transistor Q5 is turned ON to pull up the gate potential of the transistor Q2 to the Vcc level. Therefore, the low level at the gate of the transistor Q1 is maintained to prevent a d.c. current from flowing through the transistors Q1 and Q2. The transistor Q6 may be omitted, if the sense amplifier 6 is designed to maintain its outputs DO and $\overline{DO}$ at the low level during a period from the time point when the signal OCT is changed to the low level to when the data stored in the cell is supplied to the amplifier 6.

In this embodiment, the current ability of the transistor Q5 is selected to be small. Accordingly, the pull up rate of the gate potential of the transistor Q2 is made slow as shown in FIG. 2. The data output terminal $D_{OUT}$ is thereby changed to the low level gradually. As a result, the inductive noise generated at the ground terminal GND is suppressed as shown by the solid line in FIG. 2. The delay circuit 11 may produce the signal OCND with a small gradient. Also in this case, the level at the data output terminal $D_{OUT}$ falls down at a slow rate.

The gate potentials of the transistors Q1 and Q2 are held at the low level and the high level, respectively, until the data stored in the selected memory cell is supplied to the sense amplifier 6. Assuming that the selected memory cell stores the data "0", the true output DO takes the low level and the complementary output $\overline{DO}$ takes the high level. That is, the levels at gates of the transistors Q1 and Q2 are not varied. The data output terminal $D_{OUT}$ thus holds the low level.

When the address signals vary to select another memory cell, the signal generator 10 responds thereto and generates the signal OCN. The signal OCND is also generated after a time delay. At this time, the outputs DO and $\overline{DO}$ are low and high, respectively, and therefore no change in their levels occurs. If the data stored in the newly selected memory cell is "1", the sense amplifier 6 changes its true and complementary outputs DO and $\overline{DO}$ to the high level and the low level, respectively. The data output terminal $D_{OUT}$ thereby takes the high level.

In response to the change in the address signals for further selecting another memory cell, the signals OCN and OCND are generated. Accordingly, the level at the true output DO is changed to the low level, and that at the complementary output $\overline{DO}$ is pulled up to the high level at a slow rate. The inductive noise at the ground terminal is thereby suppressed. If the data stored in the selected memory cell is "1", the true and complementary outputs DO and $\overline{DO}$ are changed to the high level and the low level, respectively.

When the address signal is varied again, the levels at the true and complementary outputs DO and $\overline{DO}$ are inverted. The inductive noise at the ground terminal is suppressed, as already mentioned above. Since the data "0" is stored in this memory cell, the levels at the true and complementary outputs DO and $\overline{DO}$ do not change.

When the write-enable signal $\overline{WE}$ takes a low level, the memory device is brought into a data write operation mode. As a result, the signal OCT changes to the high level to turn the transistors Q3 and Q4 ON. The data output terminal $D_{OUT}$ then takes a high impedance. On the other hand, the signal ICT is varied to the activating level, so that a data at the data input terminal $D_{IN}$ is written into the selected memory device.

As described above in detail, the memory device shown in FIG. 1 suppresses the inductive noise which would otherwise be generated at the ground terminal GND with a large value, without deteriorating the data read-out speed.

In some memory devices, the sense amplifier 6 is designed such that the true and complementary outputs DO and $\overline{DO}$ both take the low level during the chip unselection period and the data write operation period. In that case, the transistors Q3 and Q4 are omitted, and hence it is unnecessary for the signal generator 10 to generate the signal OCN in response to the change in level of the signal OCT.

Figure 3:
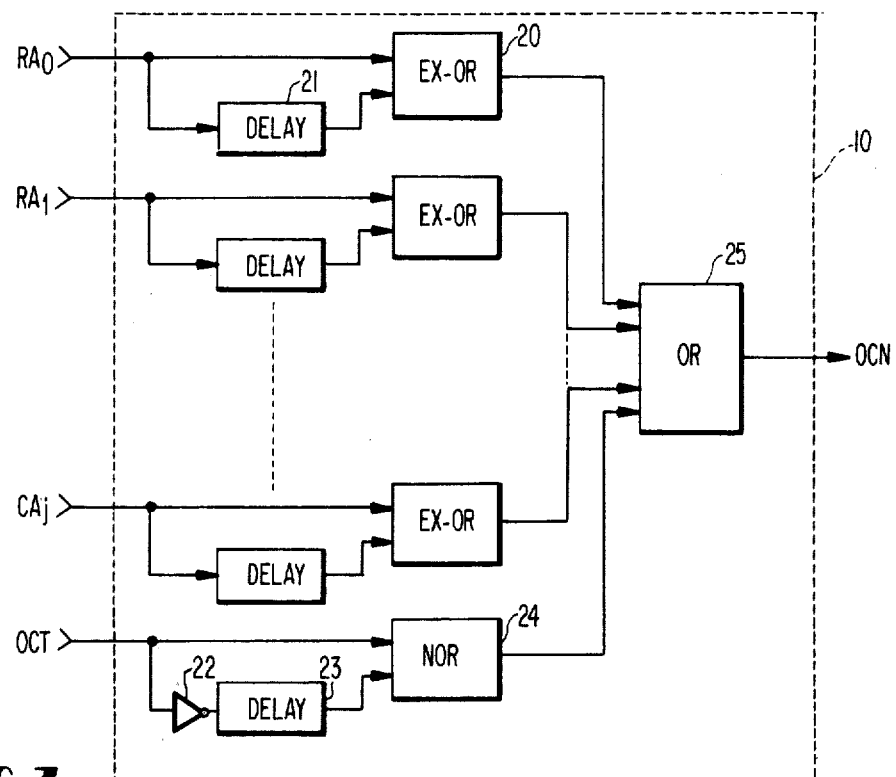
FIG. 3 is a logical circuit diagram of a signal generator 10 shown in FIG. 1.

FIG. 3 shows a logical circuit of the noise suppression signal generator 10 of FIG. 1. The generator 10 should generate the signal OCN in response to the change in at least one of the address signals RA0 to CAj from the high (and low) level and the low (and high) level as well as the change in the signal OCT from the high level to the low level. For this purpose, each of the address signals RA0 to CAj is supplied to input ends of an Exclusive-OR gate 20 directly and through a delay circuit 21, respectively, and the signal OCT is supplied to input ends of a NOR gate 24 directly and through an inverter 22 and a delay circuit 23, respectively. The outputs of the respective Exclusive-OR gates 20 and the output of the NOR gate 24 are supplied to an OR gate 25, from which the signal OCN is derived in a one-shot pulse shape. The pulse width of the signal OCN is determined by the delay time of each delay circuits 21 and 23.

Figure 4:
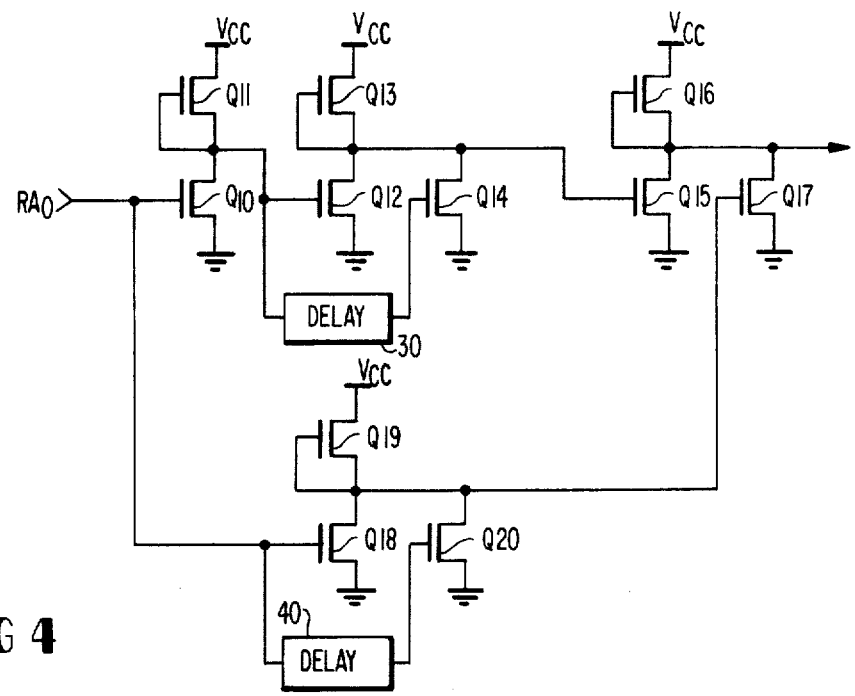
FIG. 4 is another circuit diagram representing a part of the signal generator 10.

FIG. 4 shows another example of the signal generator 10, but this Figure shows only a level change detection part provided for the address signal RA0. The signal RA0 is supplied to an inverter composed of transistors Q10 and Q11, the output of which is supplied to input ends of a first NOR gate composed of transistors Q12 to Q14 directly and through a delay circuit 30, respectively. The output of the first NOR gate is supplied to one input end of a second NOR gate composed of transistors Q15 to Q17. The address signal RA0 is further supplied to input ends of a third NOR gate composed of transistors Q18 to Q20 directly and through a delay circuit 40, respectively. The output of the third NOR gate is supplied to the other input end of the second NOR gate. Accordingly, a signal of a one-shot pulse shape is derived from the output of the second NOR gate in response to the change in the address signal RA0 from the low level to the high level and from the high level to the low level. The circuit shown in FIG. 4 is provided for each of the remaining address signals Rai to CAj, and the respective outputs are supplied to an OR gate as shown in FIG. 3.

Figure 5:
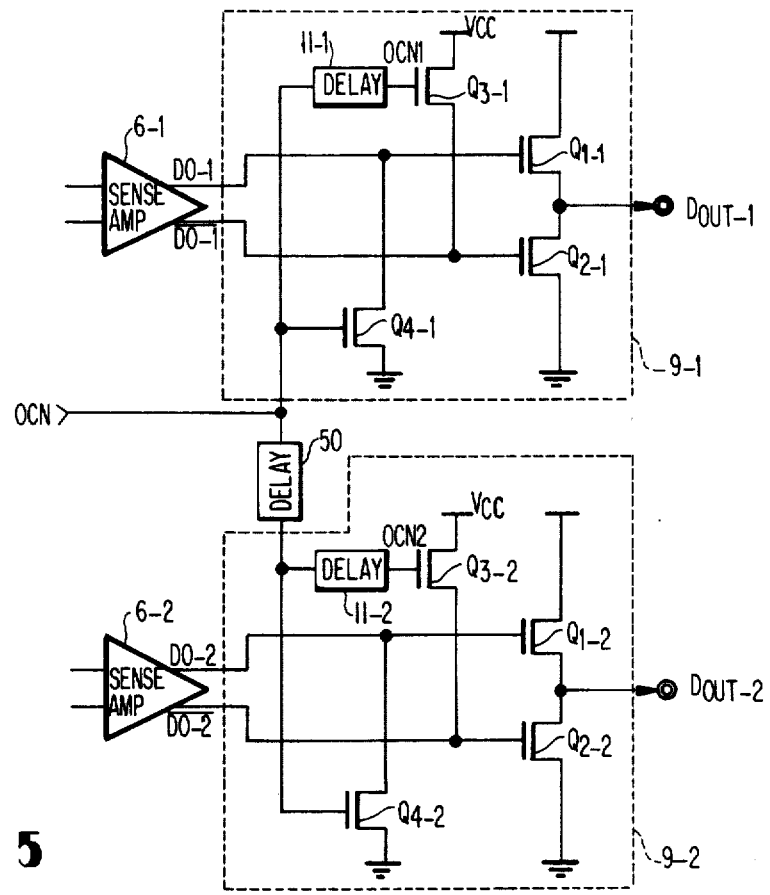
FIG. 5 is a circuit diagram of an output buffer section in a memory device according to a second embodiment of the invention.
Figure 6:
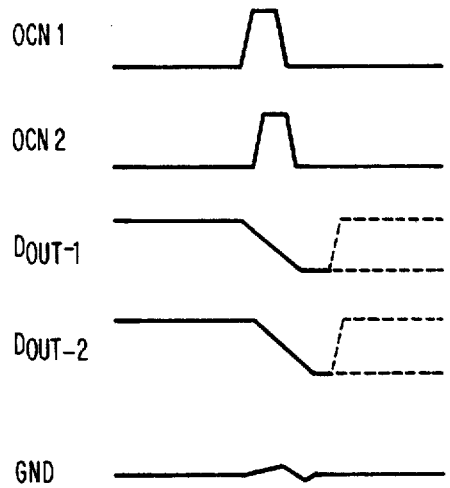
FIG. 6 is a timing chart of the circuit shown in FIG. 5.

The memory device shown in FIG. 1 outputs the data consisting of only one bit, but it is often required that the read-out data comprising a plurality of bits is derived from one memory device. In that case, a plurality of sense amplifiers 6-1 and 6-2 and output buffers 9-1 and 9-2 are provided in parallel, as shown in FIG. 5. The transistors Q3-1 and Q3-2 are provided in the respective output buffers 9-1 and 9-2 for suppressing the inductive noise at the ground terminal. In addition, the signal OCN supplied to the output buffer 9-2 is delayed by a delay circuit 50. The level at the output terminal $D_{OUT-2}$ falls down after the level at the other output terminal $D_{OUT-1}$ begins to fall, by which the increase in level of the inductive noise is suppressed. The delay circuit 50 may be omitted.

Figure 7:
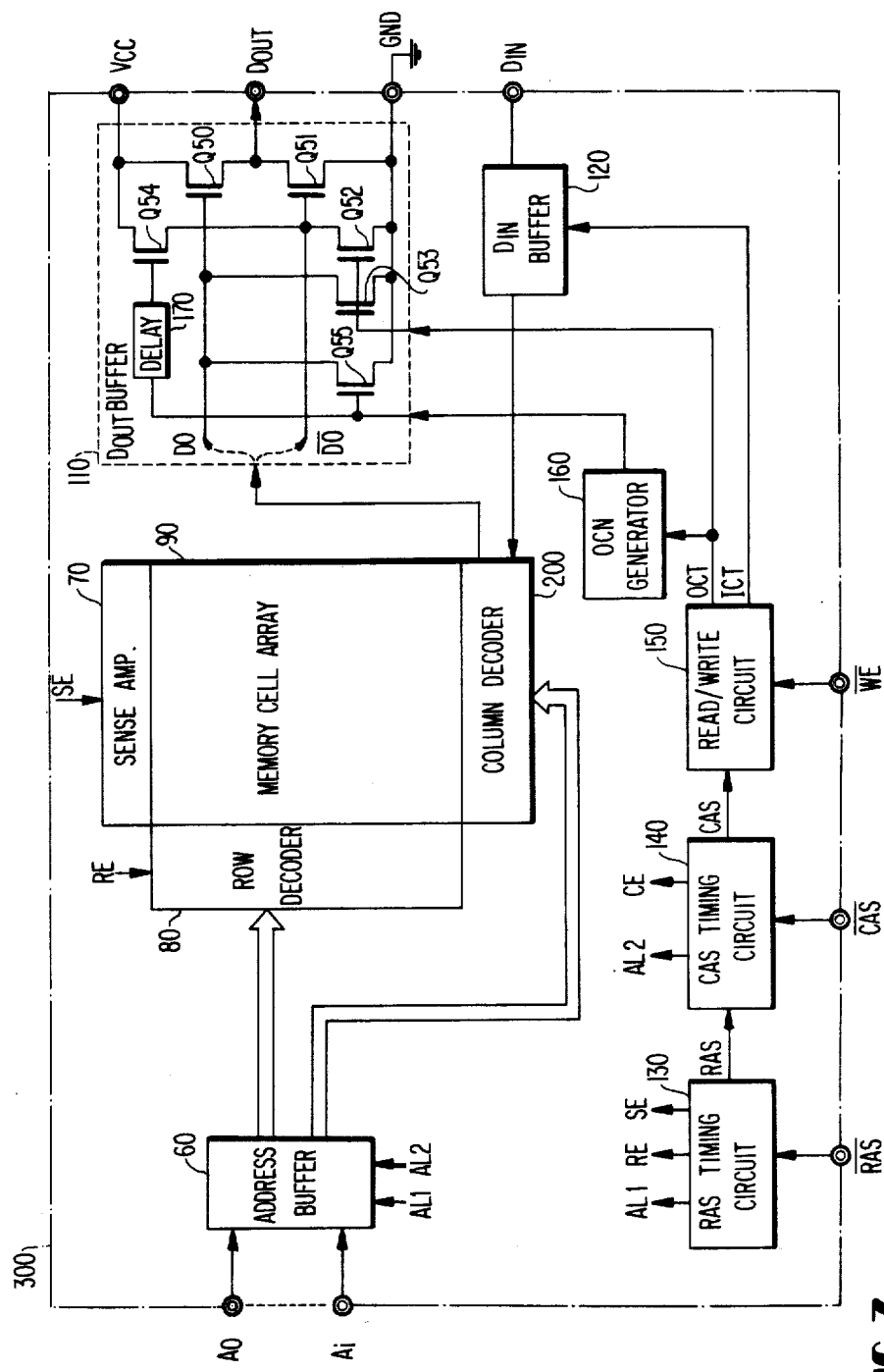
FIG. 7 is a block diagram of a memory device according to a third embodiment of the present invention.
Figure 8:
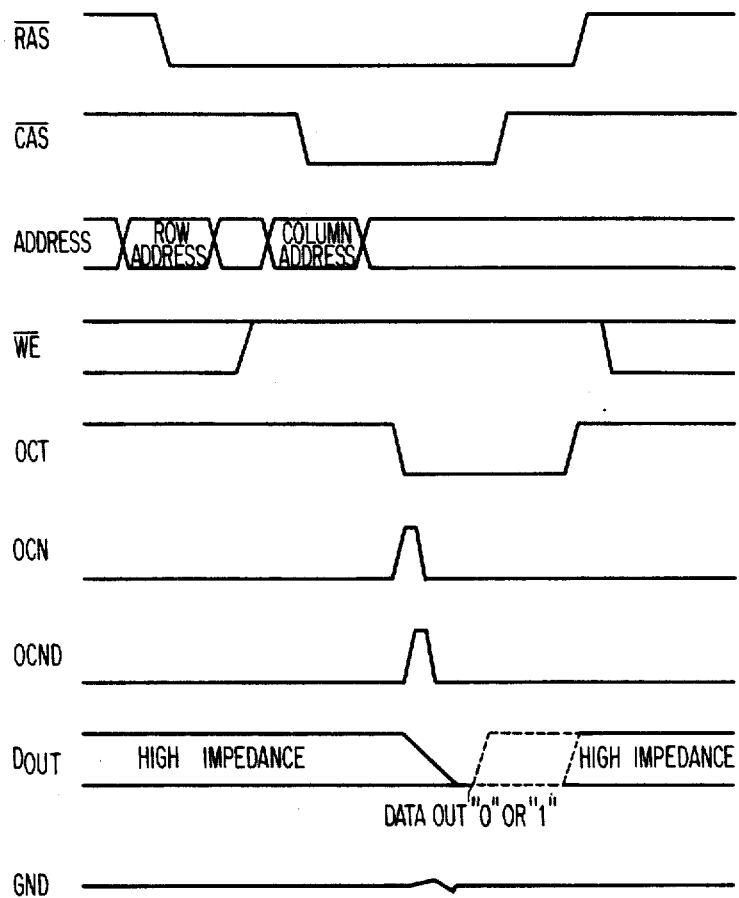
FIG. 8 is a timing chart of the memory device shown in FIG. 7.

A semiconductor memory device according to another embodiment of the present invention is shown in FIG. 7 as an integrated circuit device 300. This memory device is of a dynamic type in which row and column address signals are introduced thereinto through the same address input terminals A0 to Ai in synchronism with a row address strobe signal $\overline{RAS}$ and a column address strobe signal $\overline{RAS}$, respectively. Accordingly, the address signals cannot be employed as a signal for generating a signal OCN. FIG. 8 shows its timing chart.

When the row address signal $\overline{RAS}$ changed to the low level, a RAS timing controller 130 generates timing signals AL1, RE and SE. In response to the signal AL1, an address buffer 60 latches the signals at the address input terminals A0 to Ai as a row address signals. A row decoder 80 responds to the signal PE and the latched address signals and selects one of word lines in a memory cell array 90. A sense amplifier 70 is activated by the signal SE and amplifies the data stored in the memory cells on the selected word line to refresh them. The RAS timing controller 130 further generates a signal RAS to activate a CAS timing controller 140. When the column address strobe signal $\overline{CAS}$ changes to the low level under such a condition, the controller 140 generates timing signals AL2 and CE. The address buffer 60 introduces the signals at the terminals A0 to Ai in response to the signal AL3 and supplies them to a column decoder 200. The decoder 200 is activated by the signal CE and then selects one of digit lines. As a result, one memory cell is selected.

The CAS timing controller 140 further generates a signal CAS to activate a read/write controller 150. When a write-enable signal $\overline{WE}$ is at a high level, the data read operation is carried out. That is, the controller 150 changes the signal OCT from the high level to the low level. Transistors Q52 and Q53 are thereby turned off to activate an output buffer 110. The change in the signal OCT from the high level to the low level is carried out before the data stored in the selected memory cell is supplied to the output buffer. On the other hand, a data input buffer 120 is maintained in an inactivated state.

An OCN generator 160 responds to the level change of the signal OCT and generates a signal OCN of a one-shot pulse shape. The signal OCN is delayed by a delay circuit 170 to obtain a signal OCND. The signals OCN and OCND are supplied to transistors Q55 and Q54, respectively. The current capability of the transistor Q54 is selected to be small. Accordingly, the gate potential of a transistor Q50 is held at the low level, and that of a transistor Q51 is pulled up to the high level at a slow rate. The level at the data output terminal $D_{OUT}$ is changed to the low level gradually. The inductive noise at a ground terminal GND is thus suppressed.

The data stored in the selected memory cell is thereafter supplied to the data output buffer 110 as to true and complementary outputs DO and $\overline{DO}$. If the data is "1", the transistors Q50 and Q51 are turned ON and OFF, respectively. On the contrary, if the data is "0", the potentials at gates of the transistors Q50 and Q51 do not changed.

In order to select another memory cell, the signals $\overline{RAS}$ and $\overline{CAS}$ change to the high level. The signal OCT is thereby inverted to the high level to turn the transistors Q52 and Q53 ON. As a result, the data output terminal $D_{OUT}$ takes a thigh impedance state.

Figure 9:
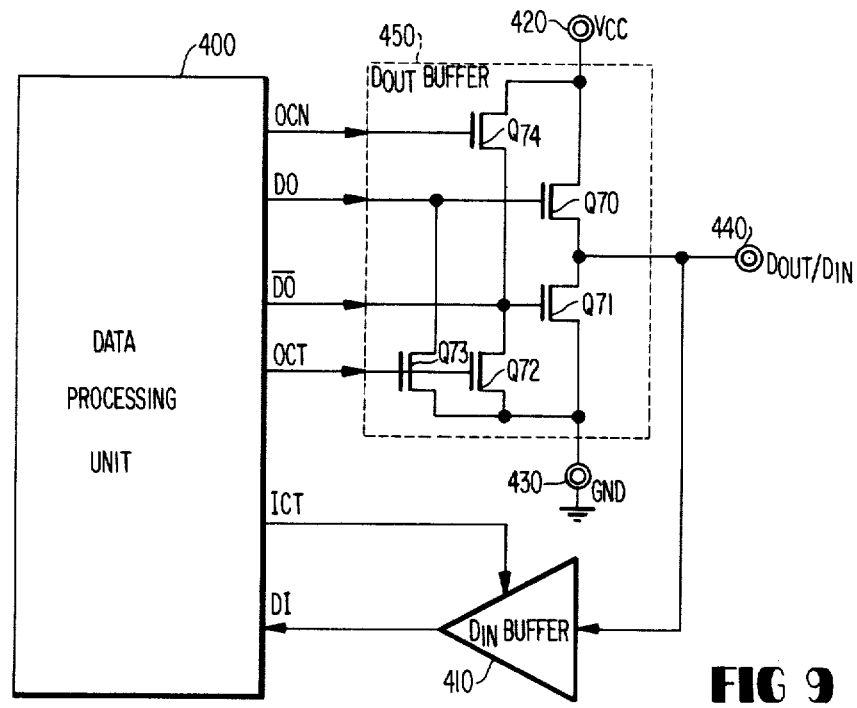
FIG. 9 is a circuit diagram representing a fourth embodiment of the invention.
Figure 10:
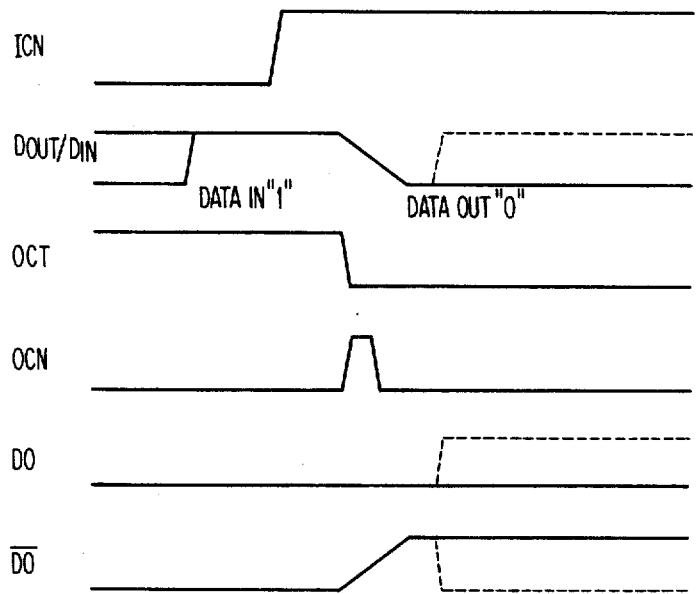
FIG. 10 is a timing chart of the circuit shown in FIG. 9.

FIG. 9 shows a fourth embodiment of the present invention, in which a data output terminal 440 is also used as a data input terminal. More specifically, a data processing unit 400 such as a central processing unit in a microcomputer outputs a data which is processed internally to the terminal 440 through a data output buffer 450, and receives externally supplied data through the terminal 440 and a data input buffer 410. The unit 400 may be a memory device shown in FIGS. 1 and 7. The timing chart of this circuit is shown in FIG. 10.

In a data receiving operation, the unit 400 makes input and output control signals ICT and OCT a low level and a high level, respectively. Transistors Q72 and Q73 are thereby turned ON to clamp the potentials at gates of transistors Q70 and Q71 connected between a Vcc terminal 420 and a ground terminal 430. As a result, the output buffer 450 is inactivated. On the other hand, the input buffer 410 is activated by the signal ICT of the low level. An input data at the terminal 440 is thus supplied through the input buffer 410 to the unit 400. Since the input data is "1" as shown in FIG. 10, the terminal 440 is changed to the high level.

In order to output a data processed internally, the unit 400 changes the signal ICT to the high level. The input buffer 410 is thereby inactivated. The unit 400 further changes the signal OCT to the low level. The transistors Q72 and Q73 are thereby turned OFF and the output buffer 450 is activated. It should be noted that, as shown in FIG. 10, a time point at which the signal OCT is changed to the low level is not coincident with a time point at which the data to be outputted is supplied to the output buffer 450. The former time point is faster than the latter. If these time points are coincident with each other, the transistors Q71 may be turned ON to quickly discharge the terminal 440, resulting in an inductive noise at the ground terminal 430.

The unit 400 generates a noise suppression signal OCN of a one-shot pulse shape simultaneously with the change from the high level to the low level of the signal OCT. A transistor Q74 is thereby turned ON. Since the transistor Q74 is designed to have a small current ability, the gate potential at the transistor Q71 rises up at a slow rate. Accordingly, the terminal 440 is discharged gradually as shown in FIG. 10. The inductive noise at the ground terminal 430 is thus suppressed. The unit 400 thereafter produces true and complementary signals DO and $\overline{DO}$ corresponding to data to be output. In the case where the data to be outputted is "0", the complementary output $\overline{DO}$ takes the high level, so that the transistor Q71 is maintained in the ON-state. No inductive noise is generated at the ground terminal 430. If the data to be outputted is "1", the levels of the signals DO and $\overline{DO}$ are changed as shown by dotted line in FIG. 10, and the terminal 440 takes the high level. An additional transistor controlled by the signal OCN may be provided as shown in FIGS. 1 and 7.

The present invention is not limited to the above-mentioned embodiment, but may be changed and modified without departing from the scope and spirit of the present invention. Further, the devices and circuits shown in the embodiments are constructed by N-channel MOS transistors, but may be formed of P-channel MOS transistors or complementary MOS transistors. According to the present invention, an inductive noise at the Vcc terminal can be suppressed by providing a transistor supplied with fhe signal OCN between the Vcc terminal and the gate of the transistor Q1 (Q50).

I claim:

1. A memory device comprising a plurality of memory cells arrayed in a matrix form, first means responsive to address signals for selecting at least one of said memory cells, second means responsive to a data stored in the selected memory cell for producing true and complementary outputs corresponding to said data, a data output terminal, a first terminal supplied with a first fixed potential, a second terminal supplied with a second fixed potential, a data output buffer circuit responsive to said true and complementary outputs for producing an output data signal at said data output terminal, said output buffer circuit including a first transistor supplied with said true output and connected between said data output terminal and said first terminal and a second transistor supplied with said complementary output and connected between said data output terminal and said second terminal, a third transistor connected between said first terminal and a control electrode of said second transistor, and third means responsive to a control signal used for a data read operation for turning said third transistor ON thereby to turn said second transistor ON before said true and complementary outputs are supplied to said first and second transistors, whereby said data output terminal is discharged by said second transistor before said output data signal is produced at said data output terminal.

2. The memory device as claimed in claim 1, wherein said address signals are employed as said control signal and said third transistor is turned ON when said address signals change.

3. The memory device as claimed in claim 1, wherein said third means turns said third transistor ON when said control signal changes from a first logic level to a second logic level.

4. The memory device as claimed in claim 3, further comprising fourth means responsive to said first logic level of said control signal for turning said first and second transistors OFF to bring said data output terminal into a high impedance state.

5. A memory device comprising a plurality of memory cells, means for selecting at least one of said memory cells, a data output terminal, a first terminal supplied with a power voltage, a second terminal supplied with a reference voltage, means for producing true and complementary signal voltages corresponding to data stored in the selected memory cell, a first field effect transistor connected between said first terminal and said data output terminal and supplied at its gate with said true signal oltage, a second field effect transistor connected between said data output terminal and said second terminal and supplied at its gate with said complementary signal voltage, said producing means changing at a first rate said complementary signal voltage from said reference voltage to a potential that turns said second transistor ON when said data is "0", a third field effect transistor connected between said first terminal and the gate of said second transistor, means for generating a control signal before said complementary voltage is changed to said potential, and means responsive to said control signal for turning said third transistor ON, said third transistor changing a voltage level at the gate of said second transistor to said potential at a second rate that is slower than said first rate.

6. The memory device as claimed in claim 5, further comprising a fourth field effect transistor connected between a gate of said first transistor and said second terminal and means responsive to said control signal for turning said fourth transistor ON thereby to turn said first transistor OFF before said third transistor is turned ON.

7. A memory device comprising first and second power supply terminals supplied respectively with first and second fixed voltages, a data output terminal, a first field effect transistor connected between said first power supply terminal and said data output terminal, a second field effect transistor connected between said second power supply terminal and said data output terminal, at least one memory cell, first means responsive to data stored in said memory cell for controlling potentials at gates of said first and second transistors in a complementary manner, a third field effect transistor connected between the gate of said second transistor and said first power supply terminal, a fourth field effect transistor connected between the gate of said first transistor and said second power supply terminal, a fifth field effect transistor connected between the gate of said second transistor and said second power supply terminal, second means for generating a first control signal, third means responsive to said first control signal for turning said fourth and fifth transistors ON thereby to turn said first and second transistors OFF, fourth means for generating a second control signal when said first control signal is absent and before said first means controls the potentials at the gates of said first and second transistors, and fifth means responsive to said second control signal for turning said third transistor ON thereby to turn said second transistor ON, whereby said data output terminal is discharged by said second transistor before said data appears at said data output terminal.

8. The memory device as claimed in claim 7, further comprising a sixth field effect transistor connected between the gate of said first transistor and said second power supply terminal and sixth means responsive to said second control signal for turning said sixth transistor ON thereby turning said first transistor OFF before said third transistor is turned ON.

9. An output buffer comprising first and second power supply terminals, first and second field effect transistors connected in series between said first and second power supply terminals, an output terminal connected to a connection point of said first and second transistors, a third field effect transistor connected between a gate of said second transistor and said first power supply terminal, a fourth field effect transistor connected between a gate of said first transistor and said second power supply terminal, a fifth transistor connected between the gate of said second transistor and said second power supply terminal, first means for generating a control signal, second means for generating a one-shot pulse signal after said control signal disappears, third means responsive to said control signal for turning said fourth and fifth transistors ON thereby to turn said first and second transistors OFF, fourth means responsive to said one-shot pulse signal for turning said third transistor ON thereby to turn said second transistor ON, and fifth means responsive to a data signal to be outputted from said output terminal for controlling said first and second transistors in a complementary manner after said one-shot pulse signal is generated.

10. The output buffer as claimed in claim 9, wherein said third transistor turns said second transistor ON at such a rate that discharges said output terminal gradually.

11. A semiconductor memory fabricated as an integrated circuit device, comprising a plurality of memory cells formed in said integrated circuit device, first means formed in said integrated circuit device and responsive to a set of address signals supplied to said integrated circuit device for selecting at least one memory cell, an external terminal formed on said integrated circuit device and outputting externally of said integrated circuit device a data signal corresponding to data stored in the selected memory cell, a first field effect transistor formed in said integrated circuit device and connected between said external terminal and a first power point, a second field effect transistor formed in said integrated circuit device and connected between said external terminal and a second power point, second means formed in said integrated circuit device for producing true and complementary internal data signals in response to the data stored in the selected memory cell, third means formed in said integrated circuit device for supplying said true and complementary internal data signals to gates of respective ones of said first and second field effect transistors, and fourth means formed in said integrated circuit device for turning said second field effect transistor ON thereby to discharge said external terminal before said true and complementary internal data signals appear at the gates of said respective first and second field effect transistors.

12. The memory as claimed in claim 11, wherein said fourth means includes a third field effect transistor connected between the gate of said second field effect transistor and said first power point and means for turning said third field effect transistor ON thereby turning said second field effect transistor ON.

13. A transistor circuit comprising first and second power nodes, an output node, a first transistor connected between said first power node and said output node, a second transistor connected between said output node and second power node, a control circuit responding to a data signal to turn said first transistor ON when said data signal takes one of binary logic levels and said second transistor ON when said data signal takes the other of said binary logic levels, said control circuit changing a potential at a control electrode of said second transistor from a first level to a second level at a first rate to turn said second transistor ON, and means for changing the potential at the control electrode of said second transistor from said first level to said second level at a second rate that is slower than said first rate before said control circuit turns one of said first and second transistors ON in response to the logic level of said data signal.

14. The transistor circuit as claimed in claim 13, wherein said means includes a third transistor connected between the control electrode of said second transistor and said first power node, said third transistor changing the potential at the control electrode of said second transistor at said second rate.

15. An integrated circuit device comprising an output circuit including first and second transistors, a signal terminal from which a data signal is derived during a period when said output circuit is in an enabled, said signal terminal being charged during a period when said output circuit is disabled, first and second power terminals, said first transistor being connected between said signal terminal and said first power terminal and said second transistor being connected between said signal terminal and said second power terminal, first means for turning one of said first and second transistors ON when said output circuit is enabled thereby to produce said data signal at said signal terminal, and second means responsive to a change from the disabled to the enabled state of said output circuit for discharging said signal terminal before said first means turns one of said first and second transistors ON.

16. The integrated circuit device as claimed in claim 15, wherein said second means includes a third transistor connected between a control electrode of said second transistor and said first power terminal, said third transistor being turned ON to turn said second transistor ON.

* * * * *

UNITED STATES PATENT AND TRADEMARK OFFICE
CERTIFICATE OF CORRECTION

PATENT NO. : 4,661,928

DATED : April 28, 1987

INVENTOR(S) : NOBUYUKI YASUOKA, Tokyo, Japan

It is certified that error appears in the above-identified patent and that said Letters Patent is hereby corrected as shown below:

Column 3, line 68, after "CAj" insert --a--.

Column 4, line 1, change "inut" to --input--.

Column 6, line 34, delete "to" and insert --in--;

Column 8, line 41, delete "$\overline{RAS}$" and insert --$\overline{CAS}$--.

Column 9, line 26, change "changed" to --change--;

line 31, change "thigh" and insert --high--.

Column 11, line 13, change "oltage" to --voltage--.

Signed and Sealed this

Fifth Day of July, 1988

Attest:

DONALD J. QUIGG

Attesting Officer      Commissioner of Patents and Trademarks